(12) United States Patent
Kwakernaak

(10) Patent No.: US 7,369,585 B2
(45) Date of Patent: May 6, 2008

(54) SEMICONDUCTOR BASED BROAD AREA OPTICAL AMPLIFIER

(75) Inventor: Martin H. Kwakernaak, New Brunswick, NJ (US)

(73) Assignee: Sarnoff Corporation, Princeton, NJ (US)

( * ) Notice: Subject to any disclaimer, the term of this patent is extended or adjusted under 35 U.S.C. 154(b) by 195 days.

(21) Appl. No.: 11/154,354

(22) Filed: Jun. 16, 2005

(65) Prior Publication Data

US 2005/0281305 A1    Dec. 22, 2005

Related U.S. Application Data

(60) Provisional application No. 60/580,261, filed on Jun. 16, 2004.

(51) Int. Cl.
*H01S 3/13* (2006.01)

(52) U.S. Cl. .............................. 372/29.011; 372/29.014; 372/29.015

(58) Field of Classification Search .............. 372/50.21
See application file for complete search history.

(56) References Cited

U.S. PATENT DOCUMENTS

| | | | | |
|---|---|---|---|---|
| 3,743,837 | A | * | 7/1973 | Pooley et al. ................ 250/206 |
| 4,483,004 | A | * | 11/1984 | Inaba et al. ............... 372/38.01 |
| 5,132,982 | A | * | 7/1992 | Chan et al. ............ 372/50.124 |
| 5,317,447 | A | * | 5/1994 | Baird et al. .................... 372/20 |
| 5,323,026 | A | * | 6/1994 | Paoli ............................ 257/85 |
| 5,331,658 | A | * | 7/1994 | Shieh et al. ........... 372/50.124 |
| 5,625,636 | A | * | 4/1997 | Bryan et al. ........... 372/50.124 |

\* cited by examiner

*Primary Examiner*—Minsun Oh Harvey
*Assistant Examiner*—Sean Hagan
(74) *Attorney, Agent, or Firm*—Lowenstein Sandler PC

(57) ABSTRACT

An optical amplifier including: a photonic gain clement; and, a transistor electromagnetically coupled to the gain element to inject current into the gain element responsively to the internal optical intensity of the gain element. The coupling of the transistor and the photonic gain element is such that as the optical intensity within the photonic gain element increases, the current injected by the transistor increases, thereby preventing filamentation in the photonic gain element.

20 Claims, 7 Drawing Sheets

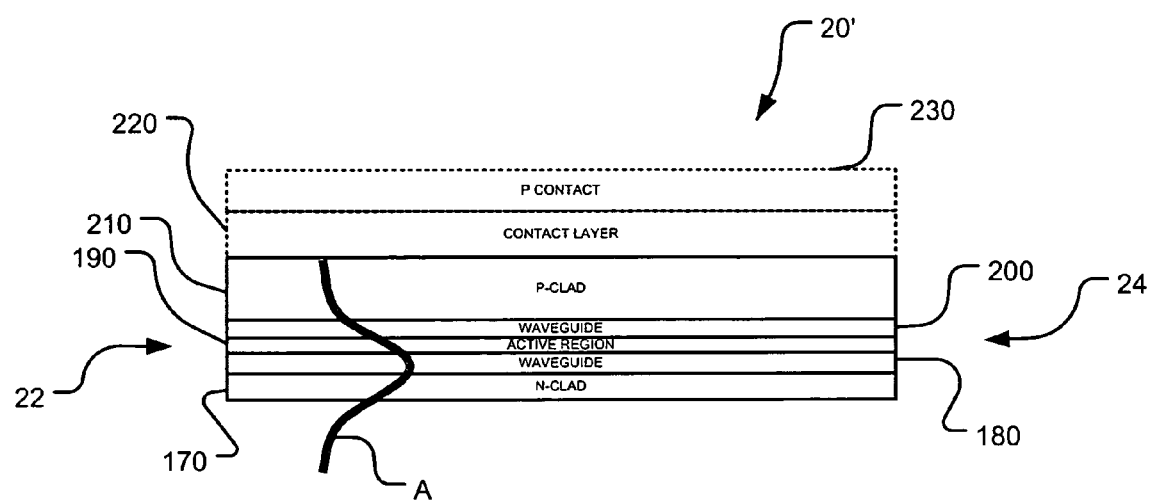
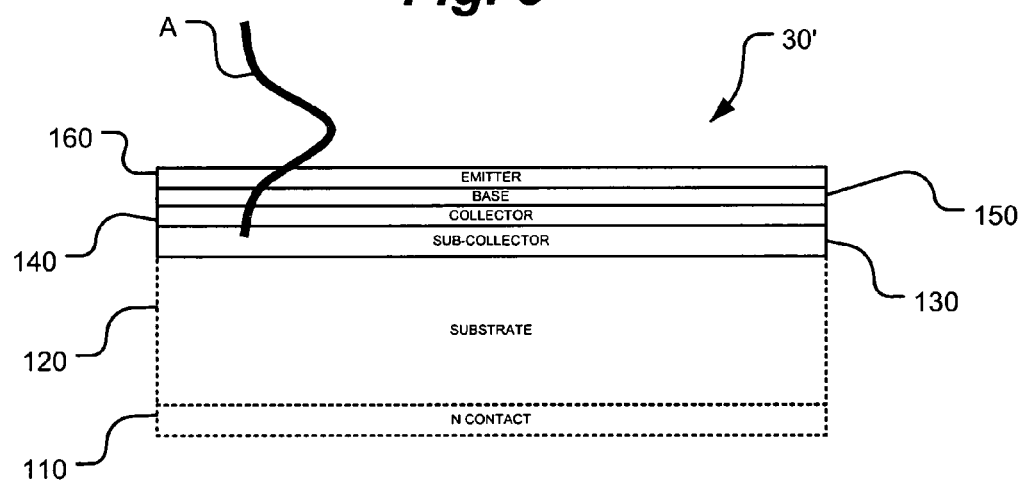

*Fig. 4A*
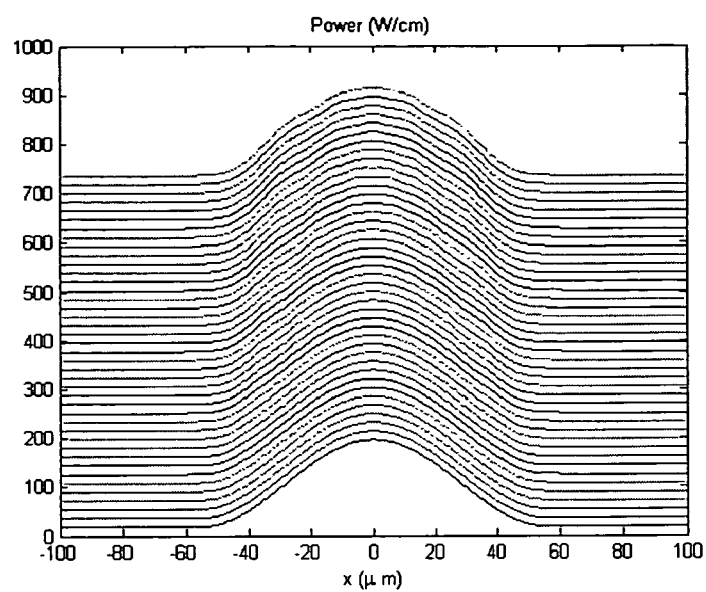
*Fig. 4B*           *Fig. 4C*
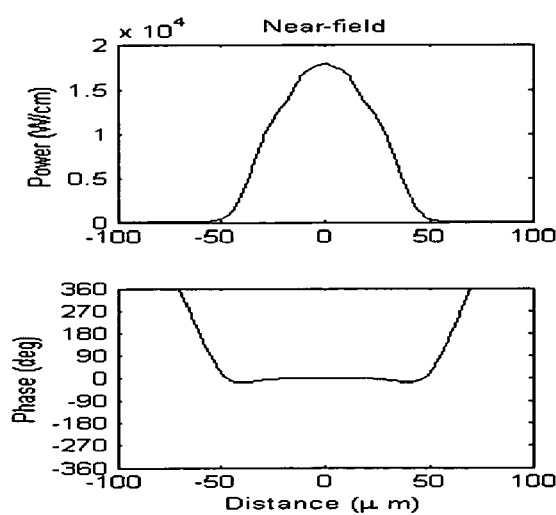 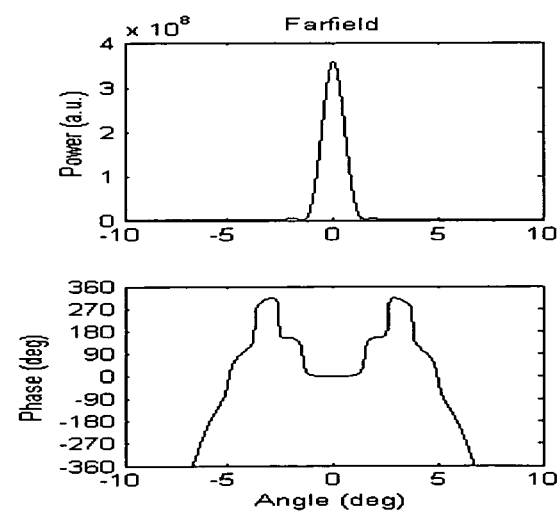
*Fig. 4D*           *Fig. 4E*

Fig. 5A
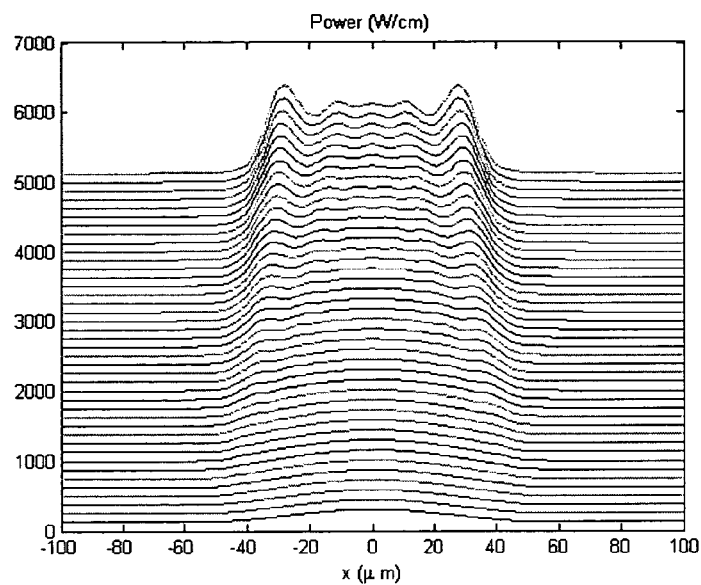
Fig. 5B            Fig. 5C
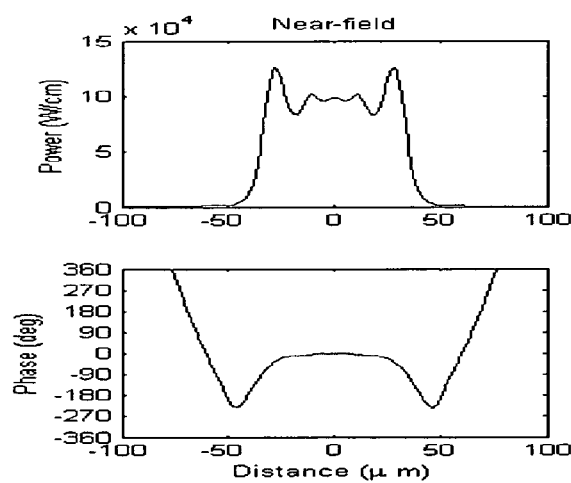 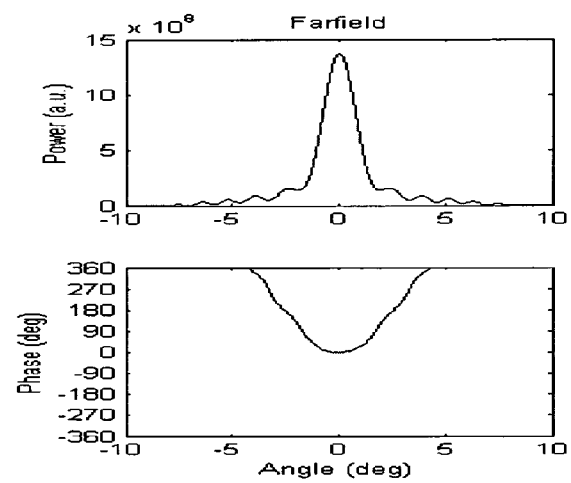
Fig. 5D            Fig. 5E

Fig. 6A
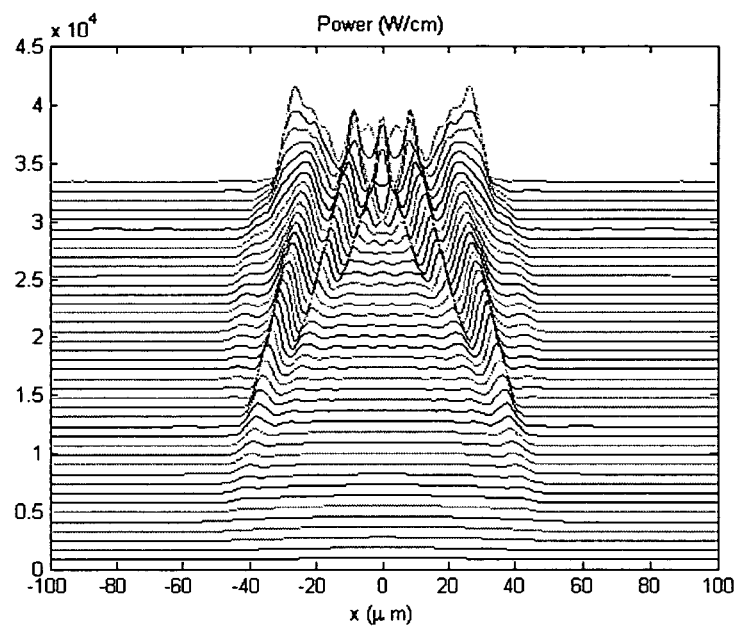
Fig. 6B
Fig. 6C
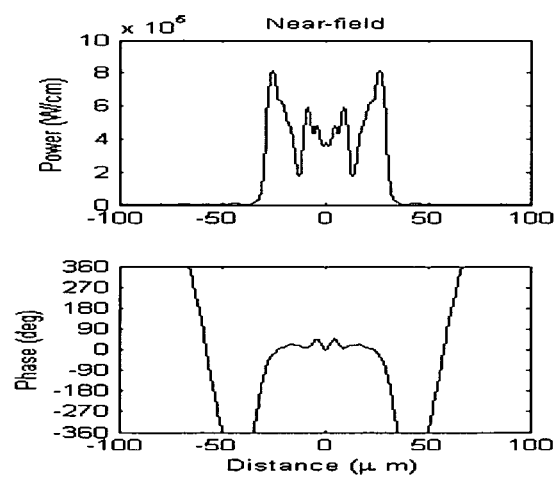
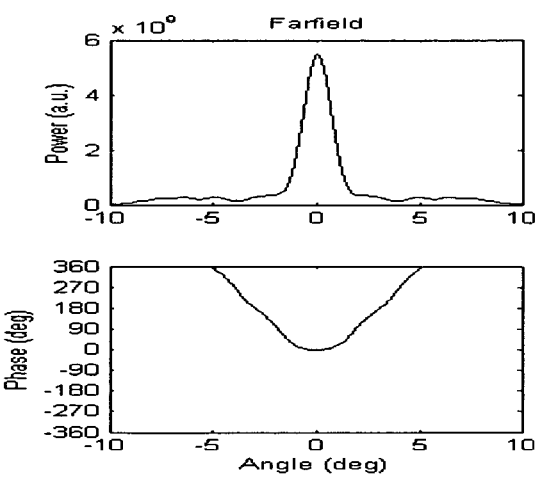
Fig. 6D
Fig. 6E

Fig. 7A
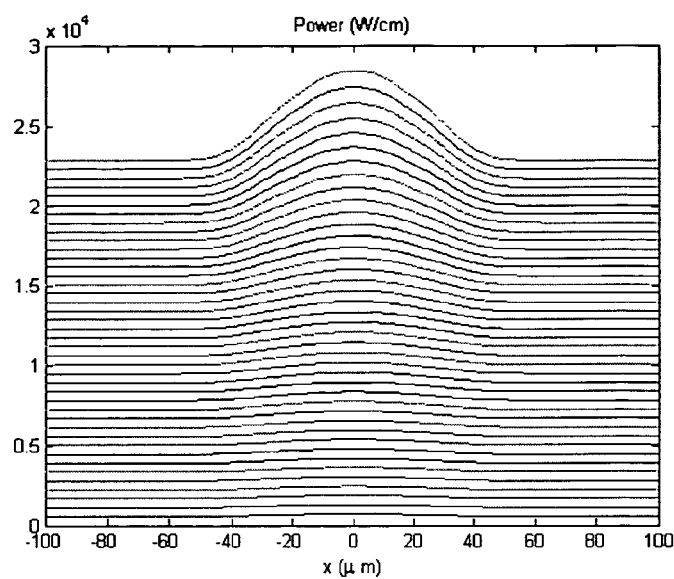
Fig. 7B  Fig. 7C
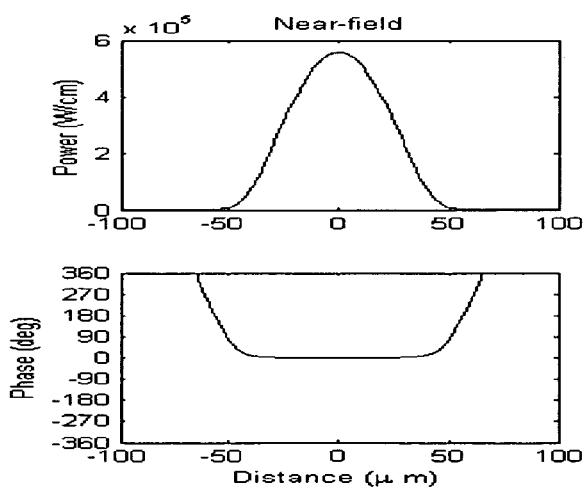 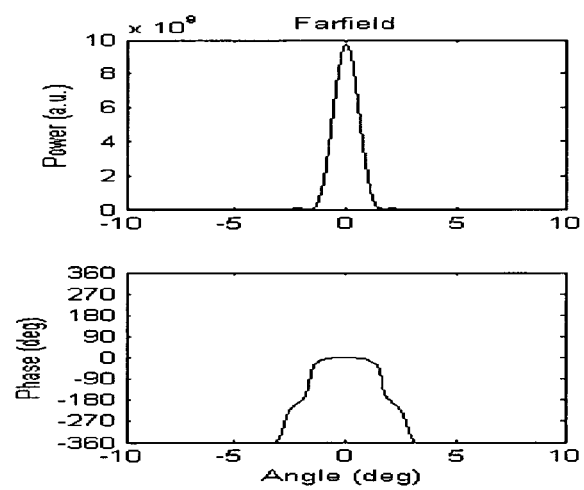
Fig. 7D  Fig. 7E

Fig. 8A
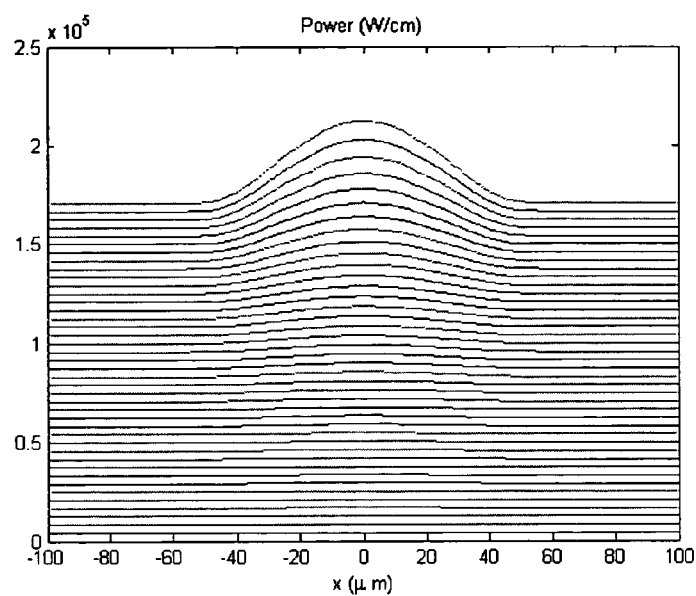
Fig. 8B  Fig. 8C
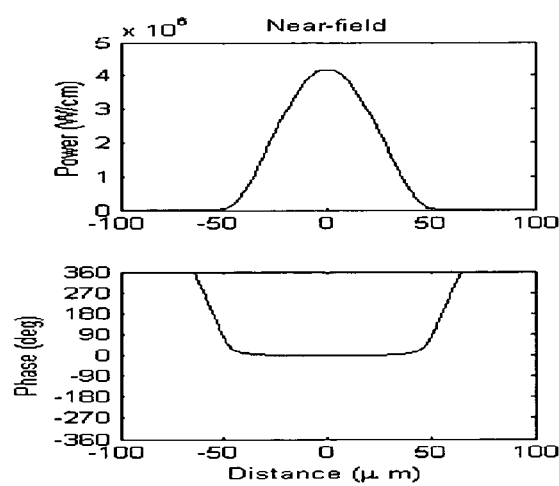 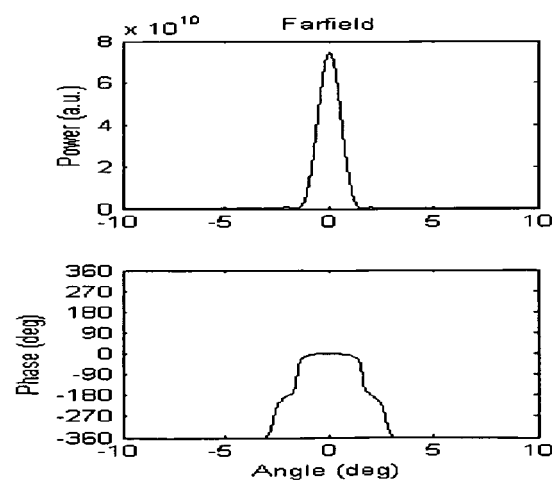
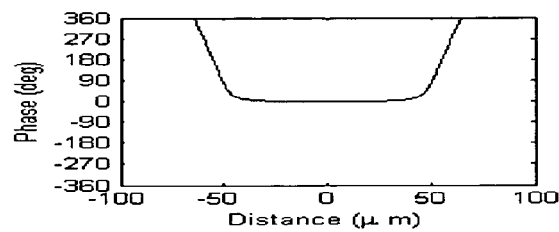 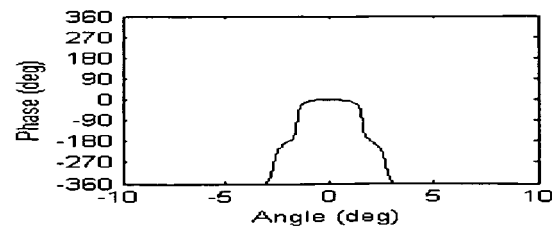
Fig. 8D  Fig. 8E

SEMICONDUCTOR BASED BROAD AREA OPTICAL AMPLIFIER

RELATED APPLICATION

This application claims priority of U.S. Patent Application Ser. No. 60/580,261, entitled VECLAA, filed Jun. 16, 2004, the entire disclosure of which is hereby incorporated by reference as if being set forth in its entirety herein.

GOVERNMENT RIGHTS

This invention was made with Government support under Contact No. MDA972-03-C-0043 awarded by the U.S. Government. The Government has certain rights in this invention.

FIELD OF THE INVENTION

The present invention relates generally to semiconductor devices, and more particularly to broad area semiconductor lasers and amplifiers.

BACKGROUND OF THE INVENTION

High optical power emitting, electrically pumped semiconductor devices, such as broad area lasers and optical amplifiers (herein collectively referred to as "broad area amplifiers") are believed to be desired. However, filamentation is known to degrade output beam quality in broad area amplifiers. Filaments typically occur when broad area amplifiers are driven at high injection currents to provide high output powers.

Filaments form because high optical power density concentrated in a local area depletes the carrier inversion in that area, due to stimulated recombination. The local depletion of carrier inversion results in a localized increase in refractive index that lenses and focuses optical energy. Existing modal profile distortion, resulting from well-known effects at a stripe edge, a distorted input beam, facet reflections and/or material non-uniformities, for example, are also increased.

It is believed the problem of filamentation has led to a general failure to effectively realize diffraction-limited high optical power emitting broad area amplifiers. While lateral waveguide tapering has been proposed to somewhat reduce filamentation to higher optical powers, approaches to mitigate filamentation, and stabilize broad area amplifier operation, are believed to be desirable.

SUMMARY OF THE INVENTION

An optical amplifier including: a photonic gain element; and, a transistor electromagnetically coupled to the gain element to inject current into the gain element responsively to the internal optical intensity of the gain element.

BRIEF DESCRIPTION OF THE FIGURES

Understanding of the present invention will be facilitated by consideration of the following detailed description of the preferred embodiments of the present invention taken in conjunction with the accompanying drawings, in which like numerals refer to like parts and in which:

FIG. 2 illustrates a quantum-well based optical amplifier gain element suitable for use with the system of FIG. 1 according to an aspect of the present invention;

FIG. 3 illustrates a phototransistor suitable for use with the gain element of FIG. 2 and the system of FIG. 1 according to an aspect of the present invention;

FIGS. 4A-6E illustrate simulation results of a conventional broad area amplifier demonstrating performance degradation with increased injection current; and, FIGS. 7A-8E illustrate simulation results of a phototransistor enhanced broad area amplifier according to an aspect of the present invention.

DETAILED DESCRIPTION OF THE INVENTION

Figure 1:
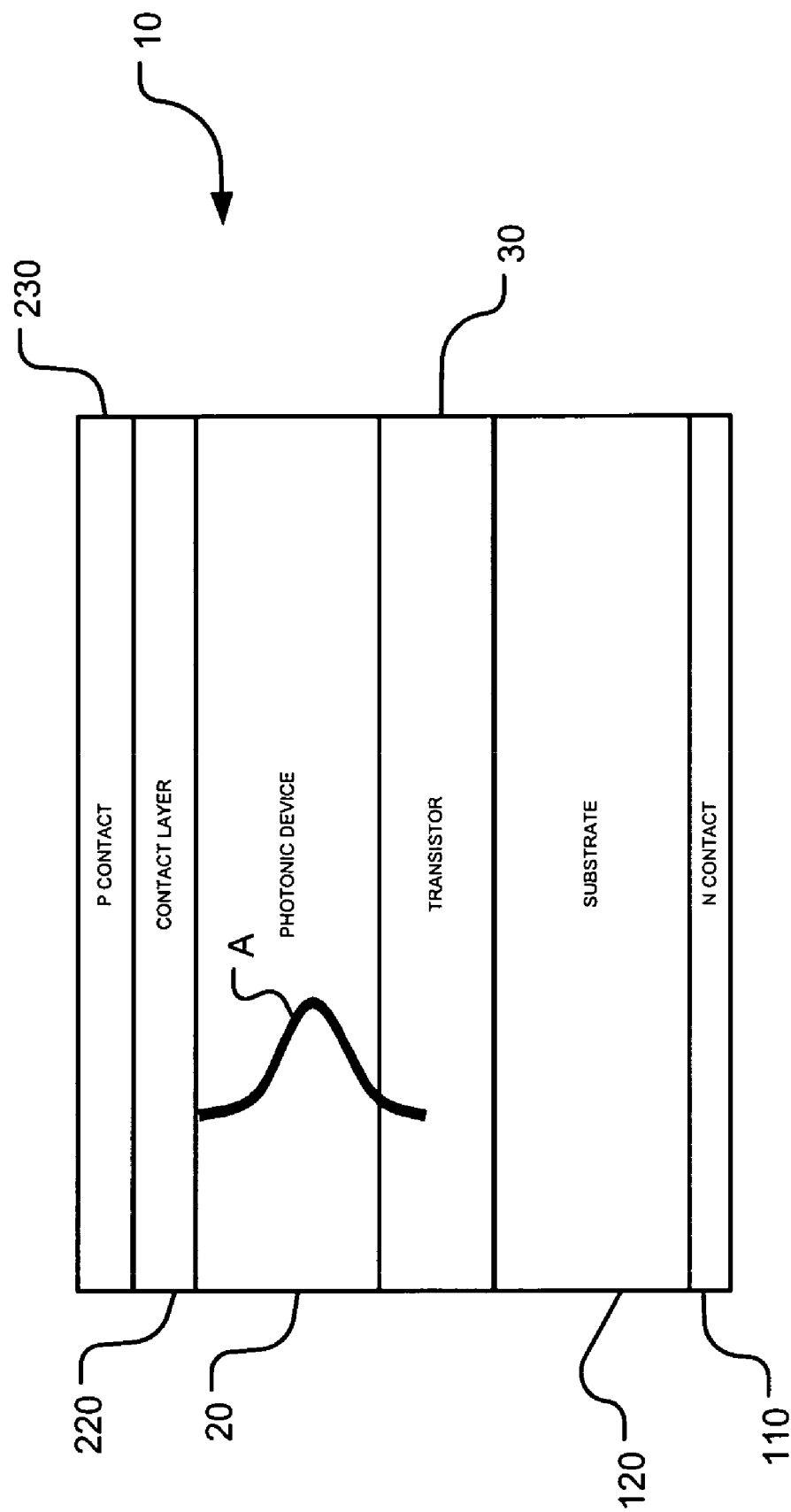
FIG. 1 illustrates a system according to an aspect of the present invention.

It is to be understood that the figures and descriptions of the present invention have been simplified to illustrate elements that are relevant for a clear understanding of the present invention, while eliminating, for purposes of clarity, many other elements found in typical semiconductor based photonic systems and methods of making and using the same. However, because such elements are well known in the art, and because they do not facilitate a better understanding of the present invention, a discussion of such elements is not provided herein. The disclosure herein is directed to all such variations and modifications known to those skilled in the art.

According to an aspect of the present invention, self focusing instability and filaments may be suppressed in semiconductor based broad area photonic devices, such as lasers and amplifiers (herein collectively referred to as "broad area amplifiers"). According to an aspect of the present invention, current feedback may be used to suppress self focusing instability and filaments in broad area amplifiers.

More particularly, according to an aspect of the present invention, local depletion of carriers in areas of high optical power density in broad area amplifiers may be mitigated—thereby mitigating local refractive index increases—and thus preventing refractive index profiling that causes filamentation. According to an aspect of the present invention, localized device current densities may be automatically increased with increasing localized photon density, thereby mitigating the localized deleterious effects of stimulated recombination leading to filamentation.

For non-limiting purposes of further explanation, the present invention will be further discussed with reference to the non-limiting figures. Referring now to FIG. 1, there is shown a schematic view of a system 10 according to an aspect of the present invention. System 10 may be monolithic in nature. System 10 generally includes a photonic gain element or device, such as a broad area amplifier 20, and current injector 30. Current injector 30 provides gain for photonic device 20 responsively to photonic device 20 photon densities. Current injector 30 may take the form of a photo-responsive transistor or avalanche photodiode, for example. The present invention will be further discussed with current injector 30 taking the form of a photo-responsive transistor for non-limiting purposes of explanation only.

System 10 may be incorporated into an external lasing cavity, for example. System 10 may be incorporated as an inline photonic gain element, also by way of example only. System 10 may be free space or fiber coupled via facets 22, 24 (FIG. 2), for example. Alternatively, one or more of facets 22, 24 may be mirrored, for example.

By way of further, non-limiting example, in the case of an external cavity laser, one facet of a chip incorporating system 10 may be coated for high reflectivity, while another facet is coated with an anti-reflection coating. The external cavity may include lenses, mirrors, filters and/or gratings, for example. In the case of a booster amplifier, both facets may be coated with an anti reflection coating. The amplifier may be seeded with an input from a single mode laser, to provide an output of much higher power but with analogous beam quality. As may be recognized by those possessing an ordinary skill in the pertinent art, system 10 is well suited for applications where high power and high beam quality are desired.

Generally, system 10 may be operated by applying an operating voltage, such as a voltage around 2-5 volts DC (VDC) across contacts 110, 230. Pulsed excitation may be used. One or more conventional contact layers (e.g., 220) may be used to improve contact efficiency.

Transistor 30 is electromagnetically coupled to photonic device 20. Transistor 30 is electromagnetically coupled to receive optical energy from gain element 20 and provide electrical energy to gain element 20 responsively thereto. For example, transistor 30 may be positioned with respect to photonic device 20 such that when an operating voltage is applied across contacts 110, 230, a portion of a resulting optical mode A of photonic device 20 overlaps with transistor 30. Transistor 30 absorbs the incident wavelength, amplifies the generated photocurrent and electrically pumps the photonic device 20 with the amplified current.

For example, in operation a phototransistor serving as transistor 30 may produce a photocurrent responsively to the tail of optical mode A overlapping with the base region/collector region interface. Emitter and sub-collector regions of the phototransistor may be substantially optically transparent to the photocurrent of optical mode A. The transistor photocurrent (that results from the optical overlap) is amplified by the phototransistor gain, and injected into an active region of photonic device 20 to provide overall optical gain in photonic device 20. Overall optical signal amplification by system 10 occurs where the absorption of the optical mode spilling into the phototransistor base/collector interface is sufficiently small and the current gain introduced by the phototransistor into an active region of the photonic device is sufficiently large.

Achievable current gain, assuming linear phototransistor operation, may be taken as $$J = \Gamma_{ph}\alpha_{ph}\beta\frac{q}{\hbar\omega}P'\qquad\text{Eq. 1}$$

where J is the current density, $\Gamma_{ph}$ is a measure of the confinement of the light to the absorbing, phototransistor base, $\alpha_{ph}$ is the absorption coefficient of the phototransistor base, $\beta$ is the current gain of the phototransistor, q is the electron charge, $\hbar\text{-}\omega$ is the photon energy and P' is the optical power per unit width.

Thus, according to an aspect of the present invention, a phototransistor 30 may be positioned with respect to photonic device 20 so as to be optically stimulated by operation of photonic device 20, and electrically pump the active region of photonic device 20 responsively thereto, to reduce filamentation in photonic device 20, and stabilize the overall operation of photonic device 20 during high optical power operation. It may be noted that injected current may be sufficient to reduce refractive index increases (leading to reduced filamentation), offset refractive index changes (mitigating filamentation) or even lead to a localized reduction in refractive index (tending to defocus optical mode A and also mitigate filamentation) responsively to a localized high optical power density.

Referring now also to FIG. 2, there is shown a schematic view of a semiconductor-based, photonic device 20' suitable for use as device 20 of system 10 of FIG. 1, according to an aspect of the present invention. Device 20' may take the form of a broad area laser or optical amplifier, for example. While the illustrated device 20' takes the form of a quantum-well based device, other configurations, such as bulk semiconductor-based devices, may also be used. FIG. 2 includes a contact 230 and contact layer 220 analogous to that of FIG. 1 for non-limiting purposes of explanation.

The illustrated device 20' includes conventional p-cladding 210, quantum well waveguide regions 200, 180 and active region 190, and n-cladding 170. Device 20' may take the form of an InP based material system, for example. Of course, other material systems may be used though. In the exemplary InP system configuration, region 210 may take the form of a p type InP region. Regions 200, 180 may take the form of Q1100 InGaAsP regions. Region 190 may take the form of a multi quantum well (MQW) InGaAsP region. And, region 170 may take the form of n type InP. In such a configuration, a Ti/Pt/Au contact may be used for contact 230, and a p+ InGaAs contact layer may be used as layer 220.

Referring now to FIG. 3, there is shown a schematic view of a device 30' suitable for use as transistor 30 of FIG. 1. The illustrated device 30' takes the form of an n-p-n phototransistor, although other configurations are possible. For purposes of explanation, the base of a phototransistor is conventionally unconnected, such that the base-collector junction is photosensitive. Absorbed light affects the base current, providing for induced photocurrent multiplication. FIG. 3 includes a contact 110 and substrate 120 analogous to that of FIG. 1 for non-limiting purposes of explanation.

Referring still to FIG. 3, the illustrated phototransistor 30' generally includes a sub-collector region 130, collector region 140, base region 150 and emitter region 160. By way of non-limiting example, phototransistor 30' may take the form of a semiconductor-based material system suitable for analogous processing as the material system of photonic device 20. For example, sub-collector region 130 may take the form of n type InP. Collector 140 may take the form of n type InGaAs or InGaAsP. Base 150 may take the form of p type InGaAs or InGaAsP. Emitter 160 may take the form of n type InP. In such a configuration, n contact 110 may take the form of a Ge/Au/Ni/Au contact, and substrate 120 may take the form of InP.

According to an aspect of the present invention, an InP substrate may be processed using conventional methodologies, such as epitaxial growth, to provide the material layers of photonic device 20 and transistor 30, as well as contacts 110, 230 and contact layer 220.

Alternatively, in an exemplary GaAs material system configuration, region 210 may take the form of a p type AlGaAs region. Regions 200, 180 may take the form of AlGaAs regions. Region 190 may take the form of a multi quantum well (MQW) InGaAs region. And, region 170 may take the form of n type AlGaAs. In such a configuration, a Ti/Pt/Au contact may be used for contact 230, and a p type GaAs contact layer may be used as layer 220. Consistently, sub-collector region 130 may take the form of n type GaAs. Collector 140 may take the form of n type InGaAs/GaAs.

Base 150 may take the form of p type GaAs. Emitter 160 may take the form of n type AlGaAs. In such a configuration, n contact 110 may take the form of a Ge/Au/Ni/Au contact, and substrate 120 may take the form of n type GaAs.

Referring now also to FIGS. 4A-4E, there are shown simulation results of a conventional broad area amplifier, having a width of 100 micrometers (μm), length of 2 millimeters (mm), a 1 watt (W) Gaussian beam input and a photo-transistor current of 0.5 amperes (amps). FIG. 4A illustrates power density watts per centimeter (W/cm) along the length of the device, while FIGS. 4B-4E illustrate near and far field data. The simulated resulting output power is 1 W.

Referring now also to FIGS. 5A-5E, there are shown simulation results of a conventional broad area amplifier, having a width of 100 μm, length of 2 mm, a 1 W Gaussian beam input and a photo-transistor current of 6 amps. FIG. 5A illustrates power density along the length of the device, while FIGS. 5B-5E illustrate near and far field data. The simulated resulting output power is 7 W. Performance degradation appears with increased injection current.

Referring now also to FIGS. 6A-6E, there are shown simulation results of a conventional broad area amplifier, having a width of 100 μm, length of 2 mm, a 1 W Gaussian beam input and a photo-transistor current of 27 amps. FIG. 9A illustrates power density along the length of the device, while FIGS. 6B-6E illustrate near and far field data. The simulated resulting output power is 30 W. Performance degradation is evident with increased injection current.

Referring now also to FIGS. 7A-7E, there are shown simulation results of a phototransistor enhanced broad area amplifier according to an aspect of the present invention, having a width of 100 μm, length of 2 mm, a 1 W Gaussian beam input and a photo-transistor current of 20 amps. FIG. 7A illustrates power density along the length of the device, while FIGS. 7B-7E illustrate near and far field data. The simulated resulting output power is 30 W.

Referring now also to FIGS. 8A-8E, there are shown simulation results of a phototransistor enhanced broad area amplifier according to an aspect of the present invention, having a width of 100 μm, length of 2 mm, a 1 W Gaussian beam input and a photo-transistor current of 30 amps. FIG. 8A illustrates power density along the length of the device, while FIGS. 8B-8E illustrate near and far field data. The simulated resulting output power is 225 W. No performance degradation appears.

For non-limiting purposes of completeness, in the simulated propagation of the light through standard broad area amplifiers and through a system according to an aspect of the present invention, a 2-Dimenstional Beam Propagation Method (BPM) algorithm linked to a rate equation model was used. This approach simulates light propagation as well as gain saturation and index deformation of the guide. Index change as a result of carrier depletion is included with a gain-index coupling coefficient (line width enhancement parameter). In the case of the standard amplifier, the injected current density was assumed to be uniform over the device area. In the case of the present invention, the injection current was linked to the optical intensity according to equation 1.

In simulating the conventional broad area amplifier, the following values were assumed.

TABLE 1

| Confinement | $\Gamma$ | 0.15% |
|---|---|---|
| Loss | $\alpha$ | 1.5 cm$^{-1}$ |
| Line width enhancement | $\alpha_N$ | 2 |
| Differential gain | $a_N$ | 1.2 10$^{-15}$ cm$^2$ |
| Transparency carrier density | $N_{tr}$ | 1.8 · 10$^{18}$ cm$^{-3}$ |

TABLE 1-continued

| Nonradiative recombination rate | A | 0.1 ns$^{-1}$ |
|---|---|---|
| Spontaneous recombination rate | B | 1 · 10$^{-10}$ cm$^3$ s$^{-1}$ |
| Wavelength | $\lambda$ | 980 nm |

In simulating systems according to aspects of the present invention, the following parameters were assumed.

TABLE 2

| Confinement to the phototransistor base-collector junction | $\alpha_{ph}$ | |
|---|---|---|
| Absorption coefficient of the phototransistor base-collector junction base | $\Gamma_{ph}$ | |
| Phototransistor current gain | $\beta$ | 40 |
| | $\alpha_{ph} \cdot \Gamma_{ph}$ | 1 cm$^{-1}$ |

As may be ascertained by one possessing an ordinary skill in the pertinent arts, a system according to the present invention may thus: experience an increase in carrier inversion with a high local photon density, where a conventional broad area amplifier exhibits a carrier inversion depletion; experience increased gain, where a conventional broad area amplifier experiences decreased gain; experience a reduction in refractive index, where a conventional broad area amplifier experiences an increase in refractive index; be de-focusing, where a conventional broad area amplifier is focusing; and, suppress filamentation, where a conventional broad area amplifier experiences filamentation.

It will be apparent to those skilled in the art that modifications and variations may be made in the apparatus and process of the present invention without departing from the spirit or scope of the invention. It is intended that the present invention cover the modification and variations of this invention provided they come within the scope of the appended claims and their equivalents.

What is claimed is:

1. An optical amplifier comprising: a photonic gain element; and, a transistor electromagnetically coupled to said gain element to inject current into said gain element, wherein as the local optical intensity within the photonic gain element increases, the local current injected by the transistor increases, causing a local reduction of index of refraction within the photonic gain element so as to defocus the optical mode of the photonic gain element and to mitigate filamentation.

2. The amplifier of claim 1, wherein, in operation, said injected current is greater than a photocurrent of the transistor.

3. The amplifier of claim 1, wherein said transistor comprises a phototransistor.

4. The amplifier oU claim 3, wherein said gain element comprises a quantum well based device.

5. The amplifier of claim 3, wherein said gain element and phototransistor are monolithically integrated.

6. The amplifier of claim 5, wherein said transistor is positioned with respect to said gain element such that a portion of an optical mode of said gain element overlaps with a base-collector interface of said phototransistor.

7. The amplifier of claim 1, wherein said gain element comprises a broad area amplifier.

8. The amplifier of claim 7, wherein said injected current increases carrier inversion in at least one portion of said gain element.

9. A monolithic, semiconductor-based, optical gain inducing device comprising: a broad area optical amplifier region; and, a current injecting region electromagnetically coupled to said optical amplifier region; wherein, upon electrically biasing said device, said current injecting region selectively injects current into said optical amplifier region and wherein as the local optical intensity within the optical amplifier region increases, the local current injected increases, causing a local reduction of index of refraction within the optical amplifier region so as to defocus the optical mode of the optical amplifier region and to mitigate filamentation.

10. The device of claim 9, wherein a portion of said current injecting region selectively injects current into a corresponding portion of said optical amplifier region responsively to an optical intensity of said corresponding portion of said optical amplifier region.

11. The device of claim 9, wherein said broad area amplifier region comprises at least one quantum well.

12. The device of claim 9, wherein said current injecting region comprises a transistor.

13. The device of claim 12, wherein said transistor comprises a phototransistor.

14. The device of claim 13, wherein said injected current is greater than a photocurrent of said phototransistor.

15. A method for stabilizing operation of a broad area optical amplifier comprising: inducing a photocurrent in a phototransistor using said broad area optical amplifier; and, injecting current into said broad area amplifier using said phototransistor; wherein as the local optical intensity within the broad area optical amplifier increases, the local injected current increases, causing a local reduction of index of refraction within the broad area optical amplifier so as to defocus the optical mode of the broad area optical amplifier and to mitigate filamentation.

16. The method of claim 15, wherein said broad area amplifier comprises at least one quantum well.

17. The method of claim 15, wherein said phototransistor comprises a base region, and an electromagnetic mode of said broad area optical amplifier overlaps with at least a portion of said base region.

18. The method of claim 15, further comprising biasing said broad area amplifier and phototransistor using common electrical contacts.

19. The method of claim 15, further comprising optically coupling at least one signal into said broad area amplifier.

20. The method of claim 15, further comprising optically coupling at least one signal out of said broad area amplifier.

* * * * *